July 30, 1968 L. LAERMER ET AL 3,395,318

CIRCUIT BOARD CARD ARRANGEMENT FOR THE INTERCONNECTION OF ELECTRONIC COMPONENTS

Filed Feb. 13, 1967 3 Sheets-Sheet 1

INVENTORS
LOTHAR LAERMER
ARTHUR J. PRETTY
PHILIP GRAY
BY
S. A. Giarratana
George B. Oujevolk
ATTORNEYS INVENTORS
LOTHAR LAERMER
ARTHUR J. PRETTY
PHILIP GRAY
BY
S. A. Giarratana
George B. Oujevolk
ATTORNEYS

INVENTORS
LOTHAR LAERMER
ARTHUR J. PRETTY
PHILIP GRAY

BY S. A. Giarratana
George B. Oujevolk
ATTORNEYS

United States Patent Office 3,395,318
Patented July 30, 1968

3,395,318

CIRCUIT BOARD CARD ARRANGEMENT FOR THE INTERCONNECTION OF ELECTRONIC COMPONENTS

Lothar Laermer, Paramus, and Arthur J. Pretty and Philip Gray, Washington Township, N.J., assignors to General Precision Inc., Little Falls, N.J., a corporation of Delaware Filed Feb. 13, 1967, Ser. No. 615,729
4 Claims. (Cl. 317—100)

ABSTRACT OF THE DISCLOSURE

The invention relates to a circuit board for the interconnection of electronic components such as flat packs and discrete components and includes a flat rectangular plate with an insulating coating having a plurality of apertures wherever necessary for passing leads. Around the plate is a metal frame and an extension which may be coupled to a heat exchanger. Over one or both faces of each flat side of the plate is an epoxy resin and an X–Y circuit board with X lines on one side and Y lines on the other. Electrostatic shielding is provided by applying a ground termination to the plate.

The present invention relates to a technique for the interconnection of electronic components, and removal of heat from the components.

In recent years, the increased functional capability of components, due to integrated circuits, introduces more leads per unit volume of component. The problem of providing more interconnections between components in a lower volume has been solved by the multilayer board technique. The present invention proposes to offset the disadvantages of multilayer methods by eliminating the need to plate holes through several circuit layers and by providing an efficient thermal path for the removal of heat from the electronic component.

Broadly stated, the present invention contemplates a packaging arrangement for electronic components in a circuit and includes a flat insulated plate with a plurality of apertures where necessary to pass leads or connections from one side of the plate to the other. Around the plate is a flat metal frame with an extension which may be coupled to a heat exchanger. Over at least one face of the plate is an epoxy resin and an X–Y circuit board with X lines on one side and Y lines on the other. Electrostatic shielding is provided by applying a ground termination to the plate.

The invention as well as other advantages thereof will become more apparent from the following detailed description when taken in connection with the accompanying drawing, in which.

Figure 1:
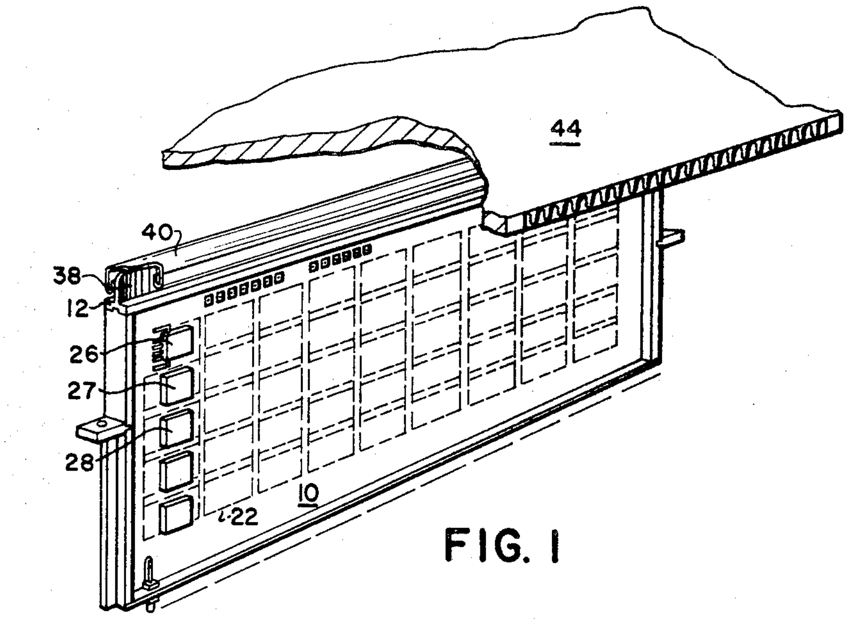
FIGURE 1 is a perspective view of a circuit board package contemplated herein.
Figure 5:
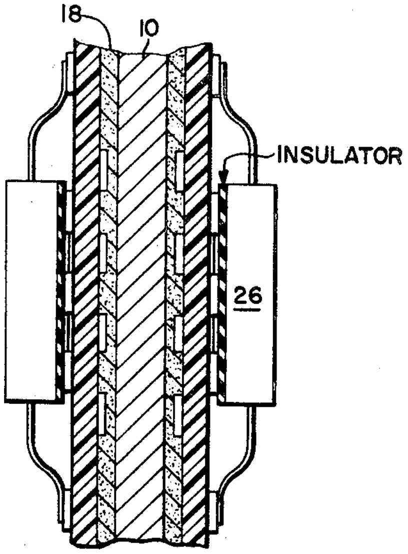
FIGURE 5 is a sectional view across the board package of FIGURE 1.
Figures 2, 3, 6:
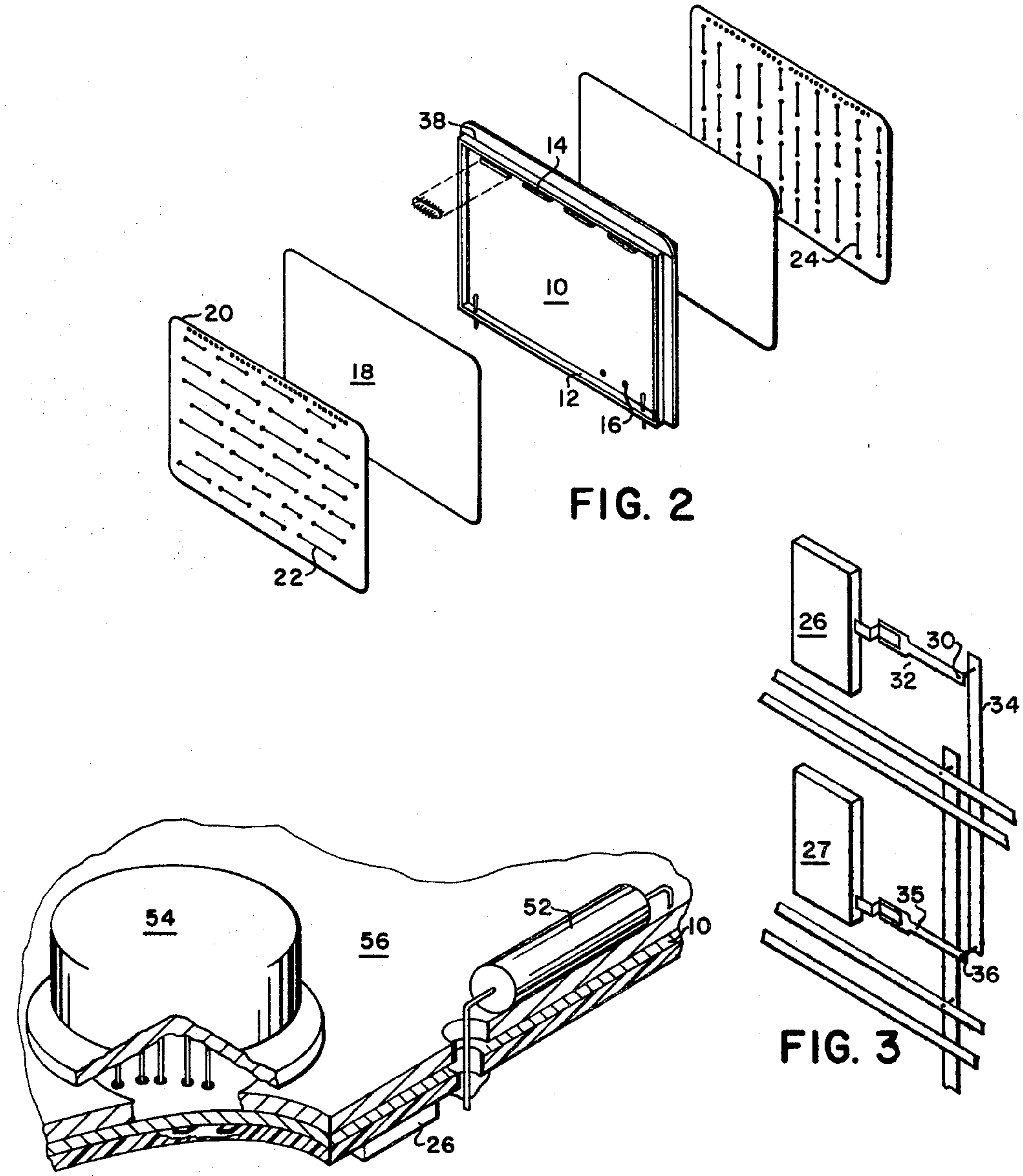
FIGURE 2 is an exploded view of a circuit board package contemplated herein.
FIGURE 3 is a view of a portion of a circuit board package using techniques described herein.
FIGURE 6 is a perspective view of the use of the contemplated concept with discrete components.
Figure 4:
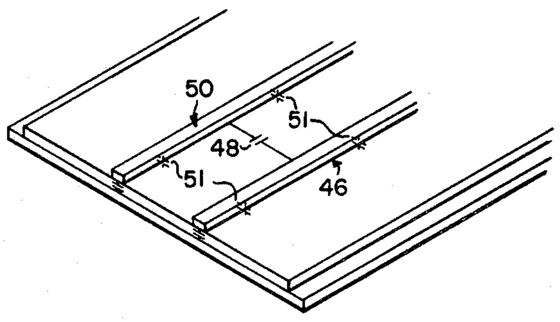
FIGURE 4 is a theoretical explanation of one of the features of the invention.

In the drawing, there is shown a flat rectangular aluminum plate 10 with an insulating coating. Around plate 10 is a frame 12 extending at right angles to the plane of plate 10. Frame 12 may be cemented around plate 10 by epoxy resin. Around one of the longer edges of plate 10 are elongated apertures 14, or holes 16. The frame may be eliminated if component protection or structural rigidity is not required. Over the face of plate 10 is an epoxy adhesive 18 which holds an X–Y panel 20 in place. X–Y panel 20 has a number of equally spaced X lines 22 on one side and Y lines 24 on the other side thereof, the two sets of lines being disposed at right angles to each other. Placed on X–Y panel 20 may be flat packs 26, 27, and 28 consisting of flip-flops and other circuit elements. Connections can therefore be made between any flat pack to any other flat pack without crossing interconnection lines. Thus, as shown in FIGURE 3, to make a connection between flat packs 26 and 27, a plated hole 30 connects X line 32 with Y line 34. X line 32 connects to flat pack 26 and Y line 34 is connected by a plated hole 36 to another X line 35 leading to flat pack 27. Extending along one longitudinal side of frame 12 and the same plate 10 is a metal extension 38. Fitted over metal extension 38 is a heat transfer clip 40 which is in close contact with extension 38 and provides a heat transfer path to a heat exchanger 44 of which it preferably forms an integral part. On the other side of plate 10 may be a circuit board in exactly the same way and electrical connection between the two sides can be made across elongated apertures 14 by interconnection clips or leads. Since there is capacitance coupling between adjacent circuits as shown in FIGURE 4, i.e., line 46 is shown as having undesired capacitance coupling 48 to an adjacent line 50, an electrostatic field is provided on plate 10 to shunt this capacitance coupling. Ground connections to the plate are provided by plated contact points to holes 16. This causes plate 10 to act as a capacitor 51 of greater capacitance than the capacitance 48 which exists between adjacent circuits 46 and 50. The capacitance noise is thus grounded into plate 10. Also, the aluminum plate provides a direct heat sink between flat packs on opposite sides of plate 10 as shown in FIGURE 5 so that the heat is readily carried to the heat exchanger 44. The insulating layer of plate 10 provides electrical insulation for discrete component leads as explained in following section.

When the circuit will include discrete components such as resistors 52 in elongated cylindrical housings or transistors 54 in small round "cheese boxes," only one side of the plate 10 may have an X–Y board whereas the other side 56 will be left with only a thin insulating coating. The discrete components are fastened to side 56 and connected to flat packs 26 by wiring through the plate. The discrete components make intimate contact to the aluminum plate on one side. The component leads pass through holes in the aluminum plate to the plated holes in the X–Y board comented to the other side of the plate as illustrated in FIGURE 6.

Figure 7:
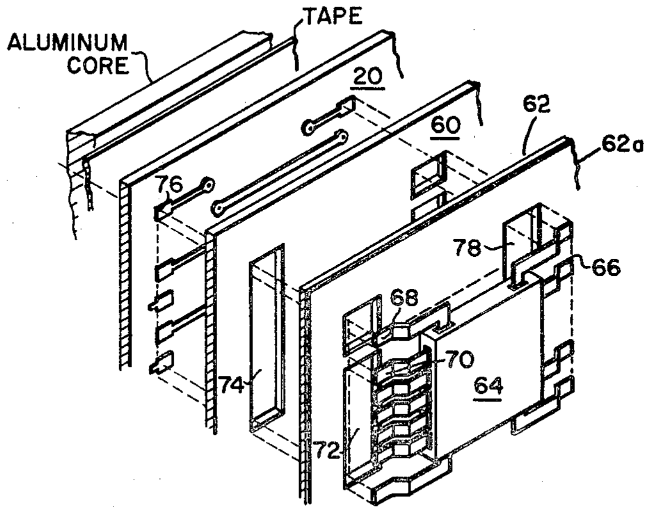
FIGURE 7 is an exploded view of the use of the contemplated concept in high frequency application.

A serious problem is often encountered with circuits in the higher frequency range, particularly past two megacycles. The tendency of interaction, radiation, and skin effect between components is difficult to control. To this end, proper shielding of the high frequency circuitry may be obtained by the arrangement shown in FIGURE 7. The high frequency power line for the high frequency power is a theoretically infinite two-dimensional power plane 60 made from a conductive thin film. On one side of this power plane 60 is a signal plane, i.e., an X–Y panel 20 disposed on an aluminum plate 10. On the other side of the power plane or conductive thin film 60 is the ground plane 62 consisting of an epoxy thin film and one the other side of the ground plane suitable ground material **62*a*, e.g., copper to act as the other side of the power line and, flat packs 64 which have power leads 66, signal leads 68 and ground leads 70. Appropriate apertures 72, 74 are cut out of the ground and power planes 60 and 62 so that signal lead 68 can be connected to the proper X line 76 in the signal plane X–Y panel 20. Likewise, an aperture 78 in the ground plane 62 enables power leads 66 to be connected to the appropriate section of the power plane. By this arrangement, the flat packs 64 are isolated from the X–Y plane and the power line and ground lead 70** can be connected to the ground plane directly while the other leads are connected to the proper plane through the apertures.

It is to be observed therefore that the present invention provides for a mounting and assembly system for electronic components particularly integrated circuits. According to the contemplated construction technique, a sandwich is formed with a metal thermal conductor as the innermost layer and on either side of which there is, insulated from the plate, a signal interconnection board. The thickness of the insulation layers are kept to a minimum to provide a short thermal path from the device to the center thermal conductor. Structural integrity of the system is provided by the epoxy-metal laminate with superior vibration damping characteristics. The thermal transfer through the thin insulation to an essentially isothermal heat sink provides efficient conduction cooling. The back-to-back component mounting technique provides a high density and efficient component assembly.

Thus, the present invention provides for an improvement in an electronic packaging arrangement for the interconnection of electronic components, said improvement comprising a flat rectangular metal plate which may have elongated apertures along one side thereof and at least one electrical connector along the other side. There is a metal frame which is electrically insulated from the center plate around the plate extending at right angles to the plane of the plate with a metal extension along one or more sides to receive a heat exchanger clip and/or mounting restraints. On the face of the plate is a thin layer of cementing material and a thin X–Y board on the cement. This X–Y board has a plurality of one set of parallel electrical connection lines extending across one side in one direction and of similar lines extending across the other side in another direction. Connection between any line on one side can be made to any line on the other side by plating a hole at the point of desired interconnection. Methods other than plating may be used to make the interconnection. The X–Y board may be on both sides of the plate and, electrostatic shielding is provided by said plate by providing for an interconnection point along one side of the plate. When discrete components are used, the X–Y board is placed on one side of the plate and the discrete components on the other. When used for high frequency application, a thin film power plane is disposed over the X–Y board and a non-conductive ground plane over the power plane. Flat pack leads are connected to the X lines of the X–Y board and to the power plane and ground plane through apertures provided in these planes.

While the present invention has been described in a preferred embodiment, it will be obvious to those skilled in the art that various modifications can be made therein within the scope of the invention, and it is intended that the appended claims cover all such modifications.

What is claimed is:

1. In an electronic X–Y circuit card arrangement for the interconnection of electronic components, the improvement therein wherein said arrangement comprises a flat electrical plate including apertures for passing connections from one X–Y board to another X–Y board along the top or from component to X–Y board, and at least one connection point along another side;

a metal frame around said plate extending at right angles to the plane of the plate and electrically insulated from said plate, a metal extension along one side to receive a heat transfer clip;

a thin insulating layer of epoxy coating on said plate; and a thin X–Y circuit board on said coating wherein a plurality of one set of parallel electrical connection lines of differing lengths extend across the X side thereof while another set of similar parallel lines extend across the Y side including holes at the points of intersection so that connection between any line on the X line can be made to any line of the Y side by placing conductive material in said hole, to connect the X to the Y line where desired.

2. An arrangement as claimed in claim 1, there being thin layers of epoxy coatings and X–Y circuit boards on both sides of said plate.

3. An arrangement as claimed in claim 2, wherein said plate provides an electrostatic shield and a heat sink with an electrical connection to said plate via a contact point or points extending along one side of the plate.

4. An arrangement as claimed in claim 3 for high frequency application including a thin film conductive power plane disposed over said X–Y circuit board, a thin film non-conductive ground plane disposed over said power plane, said ground plane and power planes including apertures for the passage of flat pack leads so that the signal lead and power leads of said flat pack can pass therethrough and be connected to the proper X-line or plane and a ground lead being connected to the ground plane.

References Cited

UNITED STATES PATENTS

| | | | |
|---|---|---|---|
| 2,932,772 | 4/1960 | Bowman et al. | 174—68.5 XR |
| 3,061,760 | 10/1962 | Ezzo | 317—100 |
| 3,147,402 | 9/1964 | Hochstetler | 317—100 |
| 3,259,805 | 7/1966 | Osipchak et al. | 317—100 |

FOREIGN PATENTS

| | | |
|---|---|---|
| 773,015 | 4/1957 | Great Britain. |

ROBERT K. SCHAEFER, *Primary Examiner.*

M. GINSBURG, *Assistant Examiner.*